United States Patent
Ueda et al.

(10) Patent No.: US 11,282,708 B2
(45) Date of Patent: Mar. 22, 2022

(54) LIGHT IRRADIATION TYPE HEAT TREATMENT METHOD AND HEAT TREATMENT APPARATUS

(71) Applicant: SCREEN Holdings Co., Ltd., Kyoto (JP)

(72) Inventors: Akitsugu Ueda, Kyoto (JP); Kazuhiko Fuse, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 0 days.

(21) Appl. No.: 16/838,211

(22) Filed: Apr. 2, 2020

(65) Prior Publication Data

US 2020/0328083 A1 Oct. 15, 2020

(30) Foreign Application Priority Data

Apr. 9, 2019 (JP) .............................. JP2019-074404

(51) Int. Cl.
*H01L 21/268* (2006.01)
*H01L 21/324* (2006.01)
(Continued)

(52) U.S. Cl.
CPC ...... *H01L 21/2686* (2013.01); *H01L 21/2254* (2013.01); *H01L 21/324* (2013.01); *H01L 21/67115* (2013.01); *H01L 21/6875* (2013.01)

(58) Field of Classification Search
CPC .............. H01L 21/225; H01L 21/2252; H01L 21/2254; H01L 21/2256; H01L 21/268;
(Continued)

(56) References Cited

U.S. PATENT DOCUMENTS 4,781,945 A * 11/1988 Nishimura ........ H01L 21/31625
438/783
5,637,528 A * 6/1997 Higashitani ....... H01L 21/31662
438/452
(Continued)

FOREIGN PATENT DOCUMENTS

JP 2007-201337 A 8/2007
JP 2018-082118 A 5/2018
(Continued)

OTHER PUBLICATIONS

Office Action and Search Report dated Jun. 9, 2021 in counterpart Taiwanese Patent Application No. 109111727 with partial English translation of the Taiwanese Office Action based on the Japanese translation.
(Continued)

*Primary Examiner* — Mary A Wilczewski
(74) *Attorney, Agent, or Firm* — Ostrolenk Faber LLP

(57) ABSTRACT

Performed is a hydrogen anneal of heating a semiconductor wafer on which a thin film containing a dopant and carbon is formed to an anneal temperature in an atmosphere containing hydrogen. Subsequently, a hydrogen atmosphere in a chamber is replaced with an oxygen atmosphere, and the semiconductor wafer is preheated to a preheating temperature in the oxygen atmosphere. Performed then is a flash heating treatment of heating a surface of the semiconductor wafer to a peak temperature for less than one second. The semiconductor wafer is heated in the oxygen atmosphere, thus activation of dopant and binding of carbon in the thin film and oxygen in the atmosphere are promoted, and carbon is exhausted from the thin film to prevent hardening of the thin film. As a result, the thin film containing carbon can be easily peeled from the semiconductor wafer.

4 Claims, 10 Drawing Sheets

(51) Int. Cl.
*H01L 21/225* (2006.01)
*H01L 21/67* (2006.01)
*H01L 21/687* (2006.01)

(58) Field of Classification Search
CPC .............. H01L 21/2686; H01L 21/324; H01L 21/67115; H01L 21/6875; H01L 21/7813
See application file for complete search history.

(56) References Cited

U.S. PATENT DOCUMENTS

| | | | | |
|---|---|---|---|---|
| 7,611,976 | B2* | 11/2009 | Ma | H01L 21/268 257/E21.347 |
| 8,129,284 | B2* | 3/2012 | Kato | H01L 21/2686 438/715 |
| 8,787,741 | B2* | 7/2014 | Kato | H01L 21/2686 392/416 |
| 9,330,949 | B2* | 5/2016 | Yokouchi | H01L 21/67115 |
| 9,449,825 | B2* | 9/2016 | Yokouchi | F27B 5/14 |
| 9,679,773 | B1 | 6/2017 | Engelhardt | H01L 21/225 |
| 9,799,517 | B2* | 10/2017 | Tanimura | H01L 21/67115 |
| 10,121,683 | B2* | 11/2018 | Aoyama | C23C 16/45557 |
| 10,790,171 | B2* | 9/2020 | Aoyama | H01L 21/67115 |
| 10,978,319 | B2* | 4/2021 | Aoyama | H01L 21/67248 |
| 2002/0130107 | A1 | 9/2002 | Izumi et al. | |
| 2010/0098879 | A1* | 4/2010 | Yokoyama | H01L 51/0003 427/553 |
| 2010/0273333 | A1* | 10/2010 | Kato | H01L 21/2686 438/795 |
| 2011/0185971 | A1* | 8/2011 | Elliott | H01L 21/268 118/712 |
| 2012/0128336 | A1* | 5/2012 | Kato | H01L 21/67115 392/416 |
| 2014/0302687 | A1 | 10/2014 | Ashihara et al. | |
| 2017/0011922 | A1* | 1/2017 | Tanimura | H01L 21/324 |
| 2017/0062249 | A1* | 3/2017 | Aoyama | H01L 21/324 |
| 2017/0117152 | A1* | 4/2017 | Aoyama | H01L 21/2253 |
| 2017/0365734 | A1* | 12/2017 | Doll | H01L 21/02288 |
| 2018/0076061 | A1* | 3/2018 | Fuse | H01L 21/265 |
| 2018/0144939 | A1 | 5/2018 | Tanimura et al. | |
| 2018/0166281 | A1* | 6/2018 | Fuse | H01L 21/6875 |
| 2020/0328083 | A1* | 10/2020 | Ueda | H01L 21/67115 |
| 2021/0051771 | A1* | 2/2021 | Fuse | H05B 3/0047 |

FOREIGN PATENT DOCUMENTS

| | | |
|---|---|---|
| KR | 10-2002-0074390 A | 9/2002 |
| WO | WO 2013/051649 A1 | 4/2013 |

OTHER PUBLICATIONS

Notification of Reason for Refusal dated Sep. 23, 2021 in counterpart Korean Patent Application No. 10-2020-0042730 with English translation obtained from Global Dossier.

Johnny C. Ho, et al., "Controlled Nanoscale Doping of Semiconductors Via Molecular Monolayers," Nature Publishing Group, Nature Materials, Jan. 2008, vol. 7, pp. 62-67.

* cited by examiner

F I G. 5
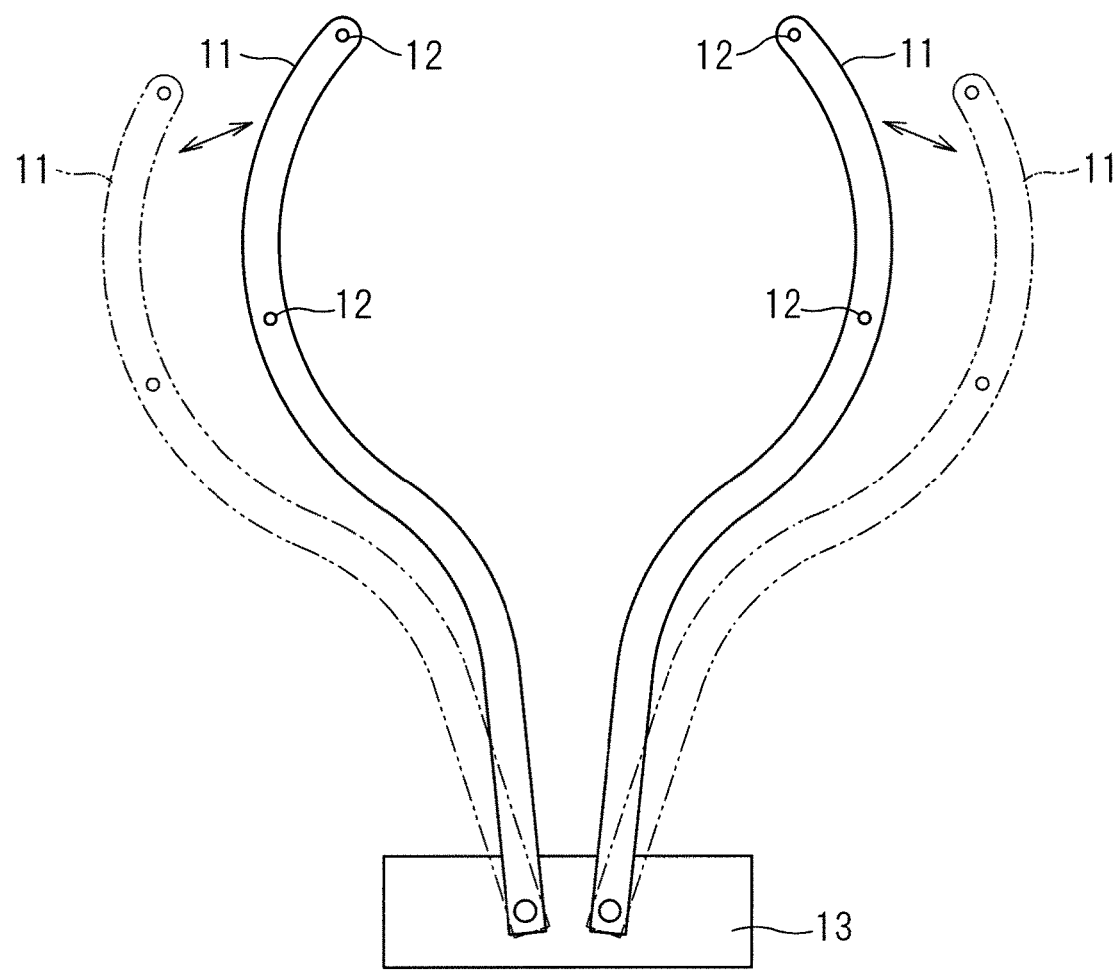

F I G. 9
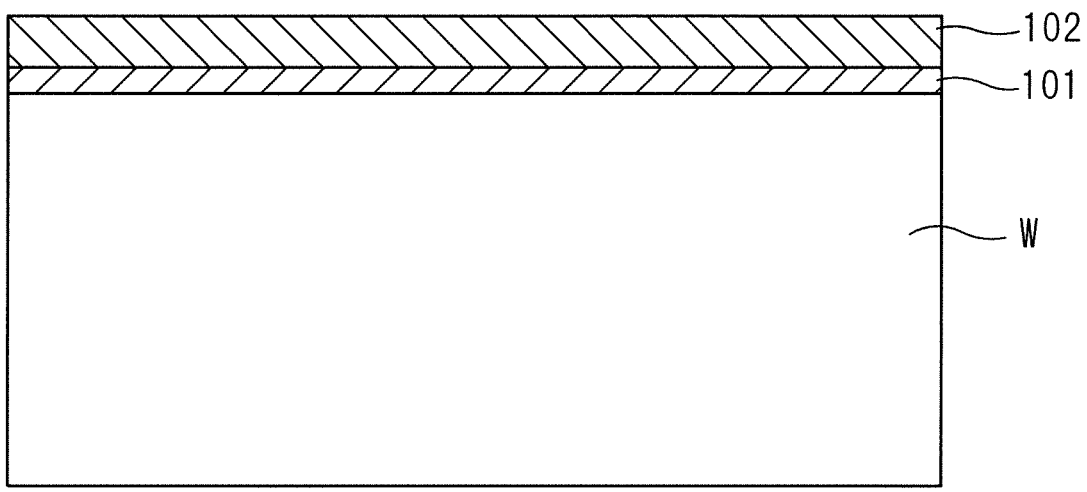

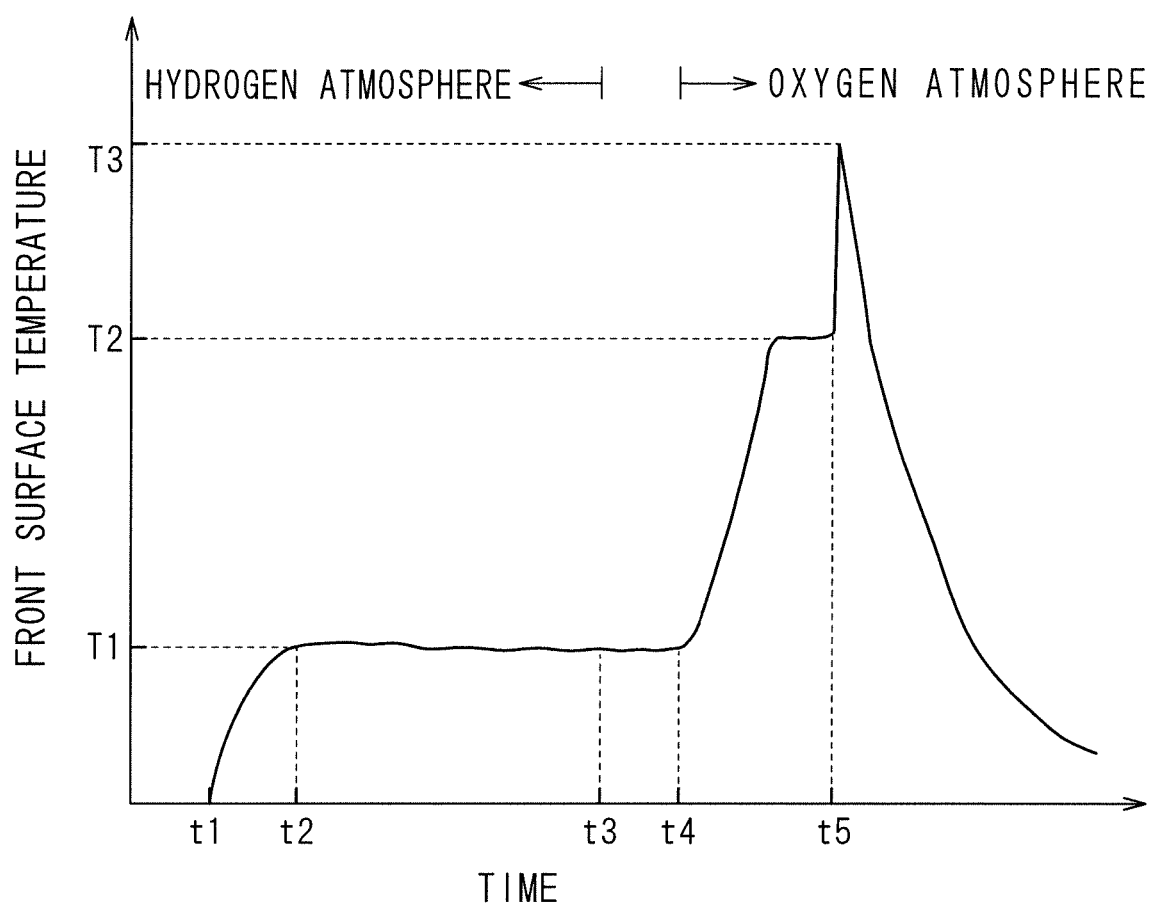
F I G . 1 0

LIGHT IRRADIATION TYPE HEAT TREATMENT METHOD AND HEAT TREATMENT APPARATUS

BACKGROUND OF THE INVENTION

Field of the Invention

The present invention relates to a heat treatment method and heat treatment apparatus which irradiates a thin plate-like precision electronic substrate (hereinafter referred to simply as a "substrate") such as a semiconductor wafer with light to heat the substrate.

Description of the Background Art

An introduction of dopant into a single crystal silicon or germanium is a necessary process in a manufacturing process of a semiconductor device. An n-type semiconductor or a p-type semiconductor is formed by introducing the dopant. The introduction of dopant is typically achieved by implanting dopant atoms such as boron (B), arsenic (As), and phosphorus (P) into a semiconductor substrate made of silicon, for example, by an ion implantation method, and performing an anneal process on the semiconductor substrate to activate the dopant atoms. However, the ion implantation method has a problem that a crystal defect occurs in the single crystal silicon, for example.

Recently made is an attempt of increasing a device capability of a conventional plane type (planar type) device structure by forming the plane type device structure into a stereoscopic structure (for example, FinFET). In a case of such a stereoscopic structure, the dopant is hardly implanted into a desired position by the ion implantation method, which has been conventionally a mainstream method, in some cases. Proposed accordingly as a dopant introduction technique different from the ion implantation method is solid source doping (SSD) forming a thin film to which a dopant such as boron and phosphorus is added on a semiconductor wafer and performing an anneal process on the thin film, thereby diffusing dopant atoms from the thin film into a semiconductor (for example, Japanese Patent Application Laid-Open No. 2007-201337).

When the thin film to which the dopant is added is formed by a spin coater, a main component of an applied material applied on the semiconductor wafer is generally an organic substance containing carbon (C). Thus, the thin film containing the dopant and carbon is formed on the semiconductor wafer. However, there arises a problem that the thin film containing carbon is hardened by the anneal process at high temperature and the hardened thin film is hardly peeled in a subsequent peeling process. Particularly, when the dopant is boron, boron and carbon bind to each other by the anneal process and boron carbide which is a superhard material is generated, so that the thin film cannot be easily peeled.

SUMMARY OF THE INVENTION

The present invention is intended for a heat treatment method of heating a substrate by irradiating the substrate with light.

According to one aspect of the present invention, a heat treatment method includes steps of: (a) storing a substrate on which a thin film containing a dopant and carbon is formed in a chamber; (b) supplying an oxidizing gas into the chamber to form an oxidizing atmosphere; and (c) irradiating the substrate with light to heat the substrate.

Oxidization of carbon in the thin film is promoted and carbon is exhausted from the thin film, thus hardening of the thin film can be prevented, and the thin film containing carbon can be easily peeled from the substrate.

Preferably, the substrate is irradiated with a flash of light including ultraviolet light.

An ashing process can be performed on the thin film by a chemical reaction of ultraviolet light, and the thin film containing carbon can be more easily peeled from the substrate.

The present invention is also intended for a heat treatment apparatus heating a substrate by irradiating the substrate with light.

According to one aspect of the present invention, a heat treatment apparatus includes: a chamber storing a substrate on which a thin film containing a dopant and carbon is formed; a gas supply part supplying an oxidizing gas into the chamber to form an oxidizing atmosphere; and a light irradiation part irradiating the substrate with light to heat the substrate.

Oxidization of carbon in the thin film is promoted and carbon is exhausted from the thin film, thus hardening of the thin film can be prevented, and the thin film containing carbon can be easily peeled from the substrate.

Preferably, flash lamps irradiate the substrate with a flash of light including ultraviolet light.

An ashing process can be performed on the thin film by a chemical reaction of ultraviolet light, and the thin film containing carbon can be more easily peeled from the substrate.

Therefore, the object of the present invention is to easily peel the thin film containing carbon.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a plan view of a transfer mechanism.

FIG. 9 is a drawing schematically showing a sectional structure of a semiconductor wafer on which a thin film containing a dopant is formed.

FIG. 10 is a view showing a change in a temperature of a surface of the semiconductor wafer.

DESCRIPTION OF THE PREFERRED EMBODIMENTS

A preferred embodiment according to the present invention will now be described in detail with reference to the drawings.

Figure 1:
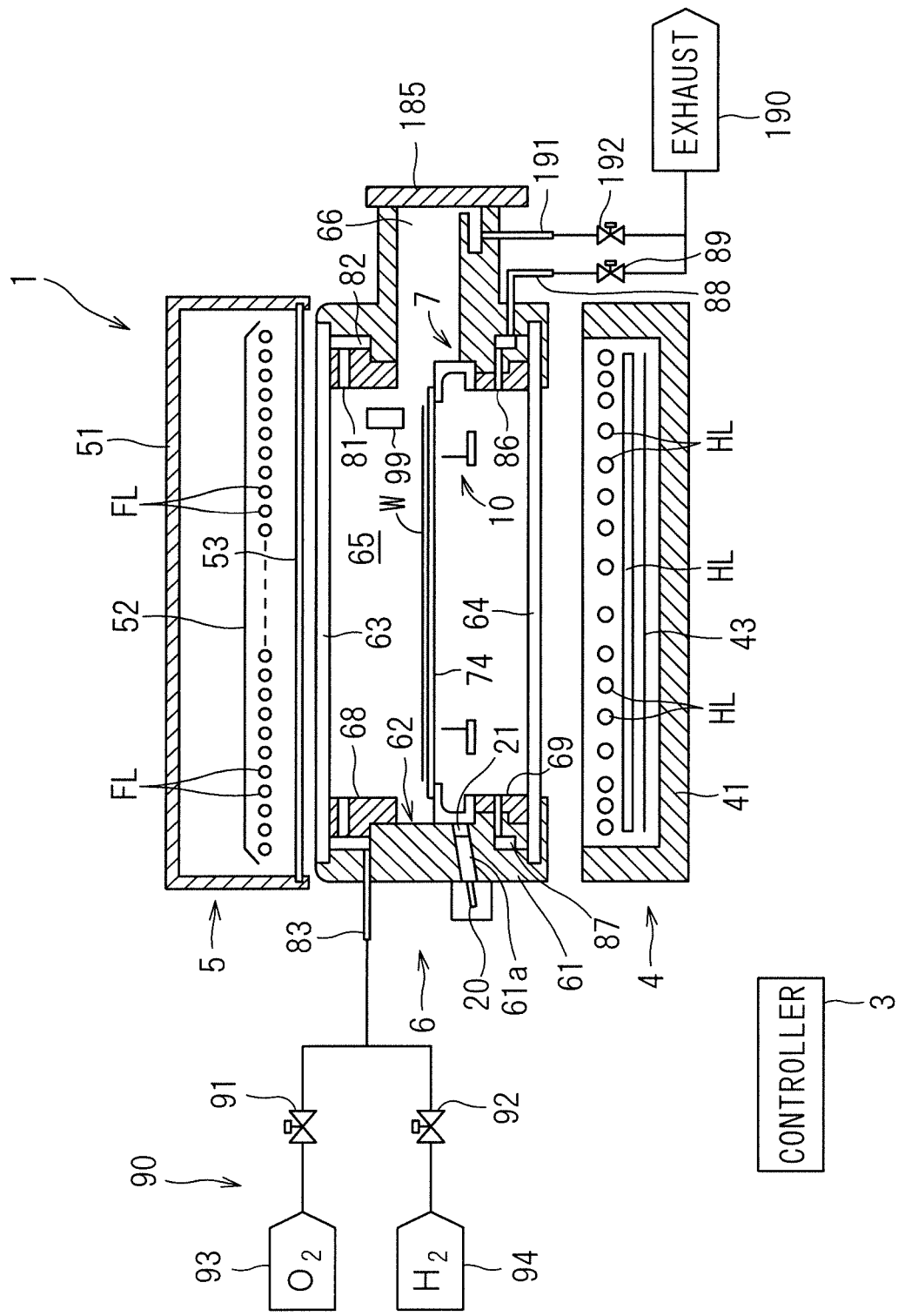
FIG. 1 is a longitudinal sectional view showing a configuration of a heat treatment apparatus according to the present invention.

Firstly, a heat treatment apparatus according to the present invention will be described. FIG. 1 is a longitudinal sectional view showing a configuration of a heat treatment apparatus 1 according to the present invention. The heat treatment apparatus 1 in FIG. 1 is a flash lamp annealer for heating a disk-shaped semiconductor wafer W serving as a substrate by irradiating the semiconductor wafer W with a flash of light. A size of the semiconductor wafer W to be treated is not particularly limited. For example, the semiconductor wafer W to be treated has a diameter of 300 mm or 450 mm. It should be noted that dimensions of components and the number of components are shown in exaggeration or in simplified form, as appropriate, in FIG. 1 and the subsequent drawings for the sake of easier understanding.

The heat treatment apparatus 1 includes a chamber 6 for receiving the semiconductor wafer W therein, a flash heating part 5 including a plurality of built-in flash lamps FL, and a halogen heating part 4 including a plurality of built-in halogen lamps HL. The flash heating part 5 is provided over the chamber 6, and the halogen heating part 4 is provided under the chamber 6. The heat treatment apparatus 1 further includes a gas supply part 90 for supplying a treatment gas into the chamber 6. The heat treatment apparatus 1 further includes a holder 7 provided inside the chamber 6 and for holding the semiconductor wafer W in a horizontal attitude, and a transfer mechanism 10 provided inside the chamber 6 and for transferring the semiconductor wafer W between the holder 7 and the outside of the heat treatment apparatus 1. The heat treatment apparatus 1 further includes a controller 3 for controlling operating mechanisms provided in the halogen heating part 4, the flash heating part 5, and the chamber 6 to cause the operating mechanisms to perform a heat treatment on the semiconductor wafer W.

The chamber 6 is configured such that upper and lower chamber windows made of quartz are mounted to the top and bottom, respectively, of a tubular chamber side portion 61. The chamber side portion 61 has a generally tubular shape having an open top and an open bottom. An upper chamber window 63 is mounted to block the top opening of the chamber side portion 61, and a lower chamber window 64 is mounted to block the bottom opening thereof. The upper chamber window 63 forming the ceiling of the chamber 6 is a disk-shaped member made of quartz, and serves as a quartz window that transmits a flash of light emitted from the flash heating part 5 therethrough into the chamber 6. The lower chamber window 64 forming the floor of the chamber 6 is also a disk-shaped member made of quartz, and serves as a quartz window that transmits light emitted from the halogen heating part 4 therethrough into the chamber 6.

An upper reflective ring 68 is mounted to an upper portion of the inner wall surface of the chamber side portion 61, and a lower reflective ring 69 is mounted to a lower portion thereof. Both of the upper and lower reflective rings 68 and 69 are in the form of an annular ring. The upper reflective ring 68 is mounted by being inserted downwardly from the top of the chamber side portion 61. The lower reflective ring 69, on the other hand, is mounted by being inserted upwardly from the bottom of the chamber side portion 61 and fastened with screws not shown. In other words, the upper and lower reflective rings 68 and 69 are removably mounted to the chamber side portion 61. An interior space of the chamber 6, i.e. a space surrounded by the upper chamber window 63, the lower chamber window 64, the chamber side portion 61, and the upper and lower reflective rings 68 and 69, is defined as a heat treatment space 65.

A recessed portion 62 is defined in the inner wall surface of the chamber 6 by mounting the upper and lower reflective rings 68 and 69 to the chamber side portion 61. Specifically, the recessed portion 62 is defined which is surrounded by a middle portion of the inner wall surface of the chamber side portion 61 where the reflective rings 68 and 69 are not mounted, a lower end surface of the upper reflective ring 68, and an upper end surface of the lower reflective ring 69. The recessed portion 62 is provided in the form of a horizontal annular ring in the inner wall surface of the chamber 6, and surrounds the holder 7 which holds the semiconductor wafer W. The chamber side portion 61 and the upper and lower reflective rings 68 and 69 are made of a metal material (e.g., stainless steel) with high strength and high heat resistance.

The chamber side portion 61 is provided with a transport opening (throat) 66 for the transport of the semiconductor wafer W therethrough into and out of the chamber 6. The transport opening 66 is openable and closable by a gate valve 185. The transport opening 66 is connected in communication with an outer peripheral surface of the recessed portion 62. Thus, when the transport opening 66 is opened by the gate valve 185, the semiconductor wafer W is allowed to be transported through the transport opening 66 and the recessed portion 62 into and out of the heat treatment space 65. When the transport opening 66 is closed by the gate valve 185, the heat treatment space 65 in the chamber 6 is an enclosed space.

The chamber side portion 61 is further provided with a through hole 61a bored therein. A radiation thermometer 20 is mounted in a location of an outer wall surface of the chamber side portion 61 where the through hole 61a is provided. The through hole 61a is a cylindrical hole for directing infrared radiation emitted from a lower surface of a semiconductor wafer W held by a susceptor 74 to be described later therethrough to the radiation thermometer 20. The through hole 61a is inclined with respect to a horizontal direction so that a longitudinal axis (an axis extending in a direction in which the through hole 61a extends through the chamber side portion 61) of the through hole 61a intersects a main surface of the semiconductor wafer W held by the susceptor 74. A transparent window 21 made of barium fluoride material transparent to infrared radiation in a wavelength range measurable with the radiation thermometer 20 is mounted to an end portion of the through hole 61a which faces the heat treatment space 65. The radiation thermometer 20 receives infrared radiation emitted from the lower surface of the semiconductor wafer W through the transparent window 21 to measure the temperature of the semiconductor wafer W, based on the intensity of the received infrared radiation.

At least one gas supply opening 81 for supplying a treatment gas therethrough into the heat treatment space 65 is provided in an upper portion of the inner wall of the chamber 6. The gas supply opening 81 is provided above the recessed portion 62, and may be provided in the upper reflective ring 68. The gas supply opening 81 is connected in communication with a supply pipe 83 of the gas supply part 90 through a buffer space 82 provided in the form of an annular ring inside the side wall of the chamber 6. The supply pipe 83 is divided into two branch pipes. One of the two branch pipes is connected to an oxygen supply source 93, and the other is connected to a hydrogen supply source 94. The branch pipe branched off from the supply pipe 83 and connected to the oxygen supply source 93 is provided with a valve 91, and the branch pipe branched off from the supply pipe 83 and connected to the hydrogen supply source 94 is provided with a valve 92. When the valve 91 is opened, oxygen gas ($O_2$) is fed from the oxygen supply source 93 to the supply pipe 83. On the other hand, when the valve 92 is opened, hydrogen gas ($H_2$) is fed from the hydrogen supply source 94 to the supply pipe 83. The oxygen supply source 93, the hydrogen supply source 94, the valve 91, the valve 92, and the supply pipe 83 constitute the gas supply part 90 of the heat treatment apparatus 1. The gas supply part 90 also includes a nitrogen supply source not shown in the drawings, thus can supply nitrogen gas ($N_2$) or a gas mixture of oxygen or hydrogen, and nitrogen to the supply pipe 83. The treatment gas fed through the supply pipe 83 flows into the buffer space 82. The treatment gas flows in a spreading manner within the buffer space 82 which is lower in fluid resistance than the gas supply opening 81, and is supplied through the gas supply opening 81 into the heat treatment space 65. The supply flow rates of oxygen and hydrogen are adjustable by respective flow regulating valves not shown and the like provided in the branch pipes.

At least one gas exhaust opening 86 for exhausting a gas from the heat treatment space 65 is provided in a lower portion of the inner wall of the chamber 6. The gas exhaust opening 86 is provided below the recessed portion 62, and may be provided in the lower reflective ring 69. The gas exhaust opening 86 is connected in communication with a gas exhaust pipe 88 through a buffer space 87 provided in the form of an annular ring inside the side wall of the chamber 6. The gas exhaust pipe 88 is connected to an exhaust part 190. A valve 89 is inserted at some midpoint in the gas exhaust pipe 88. When the valve 89 is opened, the gas in the heat treatment space 65 is exhausted through the gas exhaust opening 86 and the buffer space 87 to the gas exhaust pipe 88. The at least one gas supply opening 81 and the at least one gas exhaust opening 86 may include a plurality of gas supply openings 81 and a plurality of gas exhaust openings 86, respectively, arranged in a circumferential direction of the chamber 6, and may be in the form of slits.

A gas exhaust pipe 191 for exhausting the gas from the heat treatment space 65 is also connected to a distal end of the transport opening 66. The gas exhaust pipe 191 is connected through a valve 192 to the exhaust part 190. By opening the valve 192, the gas in the chamber 6 is exhausted through the transport opening 66.

The exhaust part 190 includes an exhaust pump. By opening the valves 89 and 192 while the exhaust part 190 is in operation, an atmosphere within the chamber 6 is exhausted through the gas exhaust pipes 88 and 191 to the exhaust part 190. When the atmosphere within the heat treatment space 65 which is an enclosed space is exhausted by the exhaust part 190 while no gas is supplied through the gas supply opening 81 into the heat treatment space 65, pressure within the chamber 6 is reduced to a pressure lower than atmospheric pressure. That is, the exhaust part 190 functions also as a pressure reduction part for reducing the pressure within the chamber 6.

Figure 2:
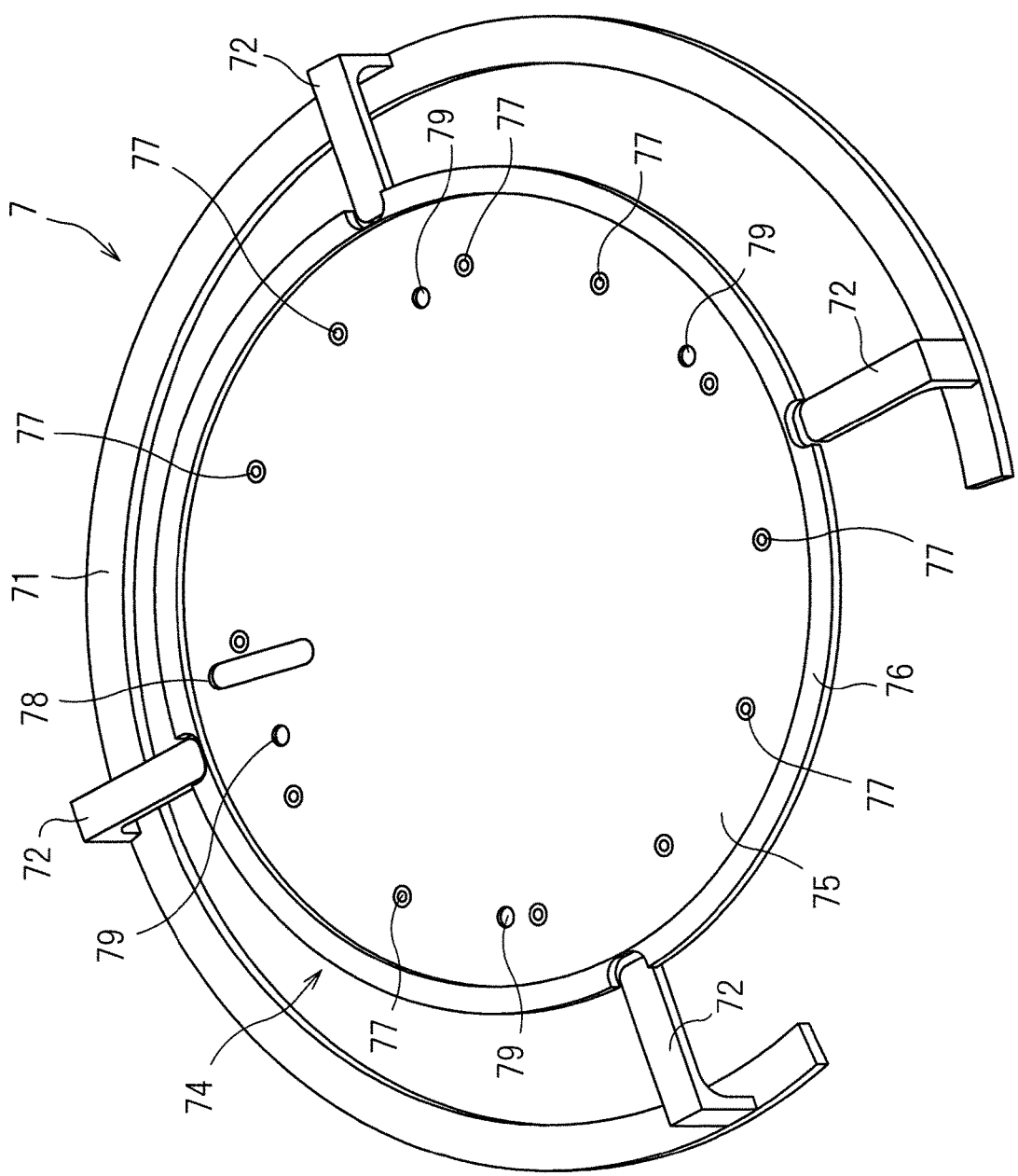
FIG. 2 is a perspective view showing an entire external appearance of a holder.

FIG. 2 is a perspective view showing an entire external appearance of the holder 7. The holder 7 includes a base ring 71, coupling portions 72, and the susceptor 74. The base ring 71, the coupling portions 72, and the susceptor 74 are all made of quartz. In other words, the whole of the holder 7 is made of quartz.

The base ring 71 is a quartz member having an arcuate shape obtained by removing a portion from an annular shape. This removed portion is provided to prevent interference between transfer arms 11 of the transfer mechanism 10 to be described later and the base ring 71. The base ring 71 is supported by a wall surface of the chamber 6 by being placed on the bottom surface of the recessed portion 62 (with reference to FIG. 1). The multiple coupling portions 72 (in the present preferred embodiment, four coupling portions 72) are mounted upright on the upper surface of the base ring 71 and arranged in a circumferential direction of the annular shape thereof. The coupling portions 72 are also quartz members, and are rigidly secured to the base ring 71 by welding.

Figure 3:
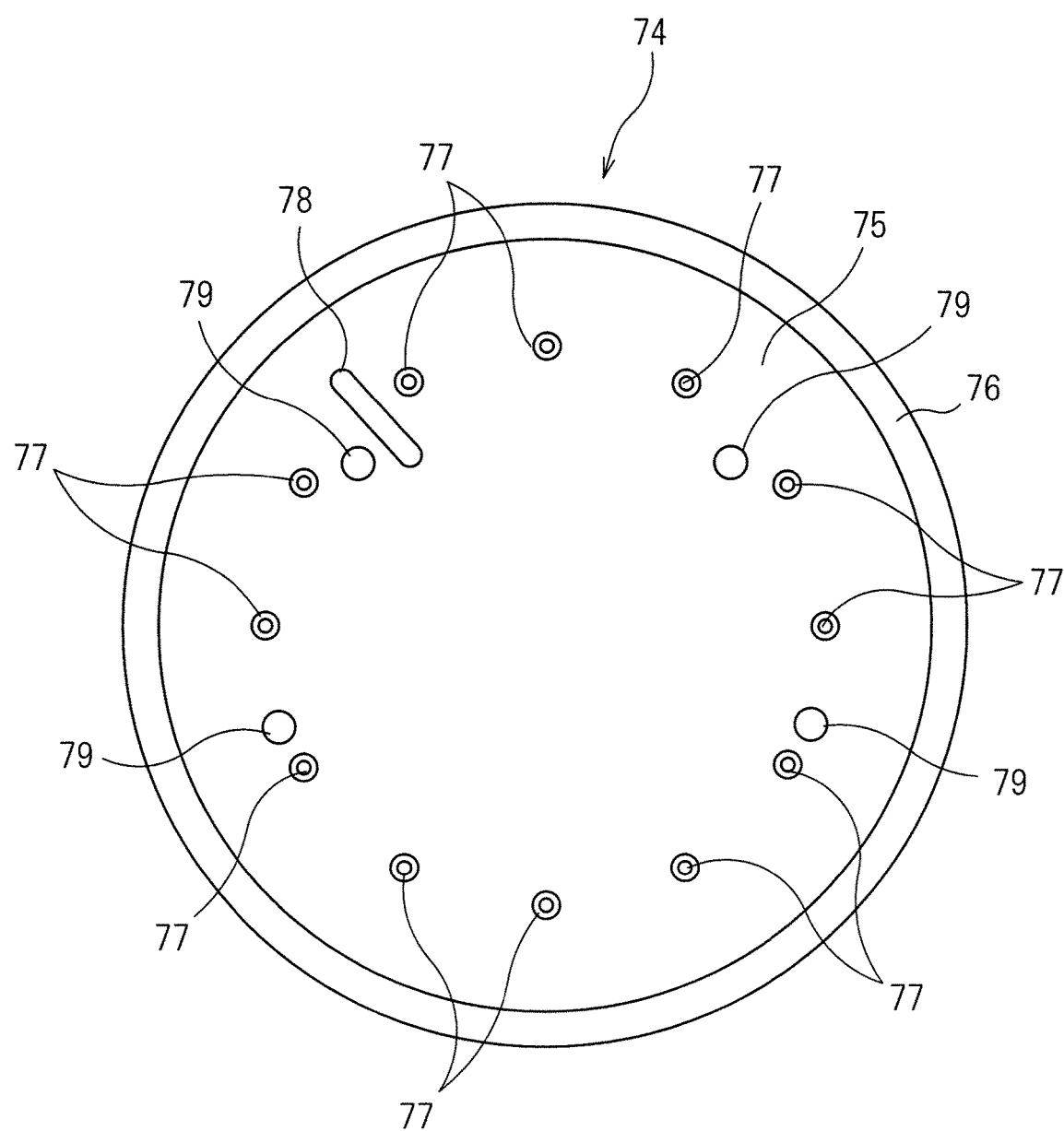
FIG. 3 is a plan view of a susceptor.
Figure 4:
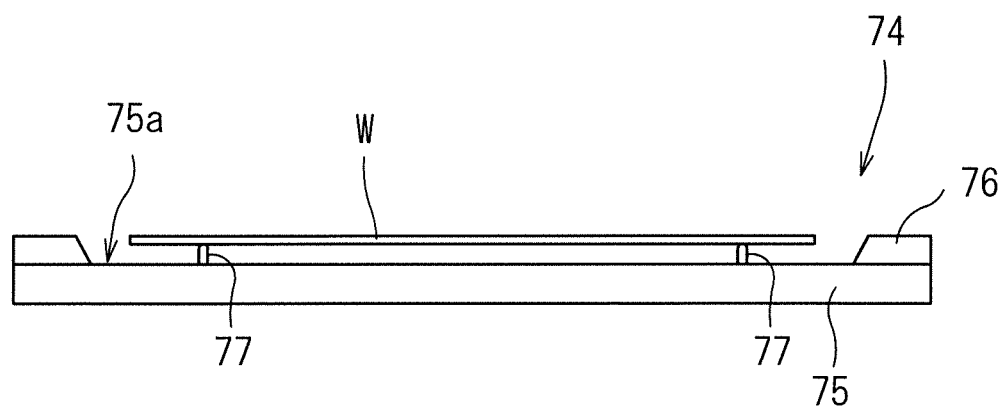
FIG. 4 is a sectional view of the susceptor.

The susceptor 74 is supported by the four coupling portions 72 provided on the base ring 71. FIG. 3 is a plan view of the susceptor 74. FIG. 4 is a cross-sectional view of the susceptor 74. The susceptor 74 includes a holding plate 75, a guide ring 76, and a plurality of substrate support pins 77. The holding plate 75 is a generally circular planar member made of quartz. A diameter of the holding plate 75 is greater than that of the semiconductor wafer W. In other words, the holding plate 75 has a size, as seen in plan view, greater than that of the semiconductor wafer W.

The guide ring 76 is provided on a peripheral portion of the upper surface of the holding plate 75. The guide ring 76 is an annular member having an inner diameter greater than the diameter of the semiconductor wafer W. For example, when the diameter of the semiconductor wafer W is 300 mm, the inner diameter of the guide ring 76 is 320 mm. The inner periphery of the guide ring 76 is in the form of a tapered surface which becomes wider in an upward direction from the holding plate 75. The guide ring 76 is made of quartz similar to that of the holding plate 75. The guide ring 76 may be welded to the upper surface of the holding plate 75 or fixed to the holding plate 75 with separately machined pins and the like. Alternatively, the holding plate 75 and the guide ring 76 may be machined as an integral member.

A region of the upper surface of the holding plate 75 which is inside the guide ring 76 serves as a planar holding surface 75a for holding the semiconductor wafer W. The substrate support pins 77 are provided upright on the holding surface 75a of the holding plate 75. In the present preferred embodiment, a total of 12 substrate support pins 77 provided upright are spaced at intervals of 30 degrees along the circumference of a circle concentric with the outer circumference of the holding surface 75a (the inner circumference of the guide ring 76). The diameter of the circle on which the 12 substrate support pins 77 are disposed (the distance between opposed ones of the substrate support pins 77) is smaller than the diameter of the semiconductor wafer W, and is 270 to 280 mm (in the present preferred embodiment, 270 mm) when the diameter of the semiconductor wafer W is 300 mm. Each of the substrate support pins 77 is made of quartz. The substrate support pins 77 may be provided by welding on the upper surface of the holding plate 75 or machined integrally with the holding plate 75.

Referring again to FIG. 2, the four coupling portions 72 provided upright on the base ring 71 and the peripheral portion of the holding plate 75 of the susceptor 74 are rigidly secured to each other by welding. In other words, the susceptor 74 and the base ring 71 are fixedly coupled to each other with the coupling portions 72. The base ring 71 of such a holder 7 is supported by the wall surface of the chamber 6, whereby the holder 7 is mounted to the chamber 6. With the holder 7 mounted to the chamber 6, the holding plate 75 of the susceptor 74 assumes a horizontal attitude (an attitude such that the normal to the holding plate 75 coincides with a vertical direction). In other words, the holding surface 75a of the holding plate 75 becomes a horizontal surface.

The semiconductor wafer W transported into the chamber 6 is placed and held in a horizontal attitude on the susceptor 74 of the holder 7 mounted to the chamber 6. At this time, the semiconductor wafer W is supported by the 12 substrate support pins 77 provided upright on the holding plate 75, and is held by the susceptor 74. More strictly speaking, the 12 substrate support pins 77 have respective upper end portions coming in contact with the lower surface of the semiconductor wafer W to support the semiconductor wafer W. The semiconductor wafer W can be supported in a horizontal attitude by the 12 substrate support pins 77 because the 12 substrate support pins 77 have a uniform height (distance from the upper ends of the substrate support pins 77 to the holding surface 75a of the holding plate 75).

The semiconductor wafer W supported by the substrate support pins 77 is spaced a predetermined distance apart from the holding surface 75a of the holding plate 75. A thickness of the guide ring 76 is greater than the height of the substrate support pins 77. Thus, the guide ring 76 prevents the horizontal misregistration of the semiconductor wafer W supported by the substrate support pins 77.

As shown in FIGS. 2 and 3, an opening 78 is formed in the holding plate 75 of the susceptor 74 so as to extend vertically through the holding plate 75 of the susceptor 74. The opening 78 is provided for the radiation thermometer 20 to receive radiation (infrared radiation) emitted from the lower surface of the semiconductor wafer W. Specifically, the radiation thermometer 20 receives the radiation emitted from the lower surface of the semiconductor wafer W through the opening 78 and the transparent window 21 mounted to the through hole 61a in the chamber side portion 61 to measure the temperature of the semiconductor wafer W. The holding plate 75 of the susceptor 74 further includes four through holes 79 bored therein and designed so that lift pins 12 of the transfer mechanism 10 to be described later pass through the through holes 79, respectively, to transfer the semiconductor wafer W.

Figure 6:
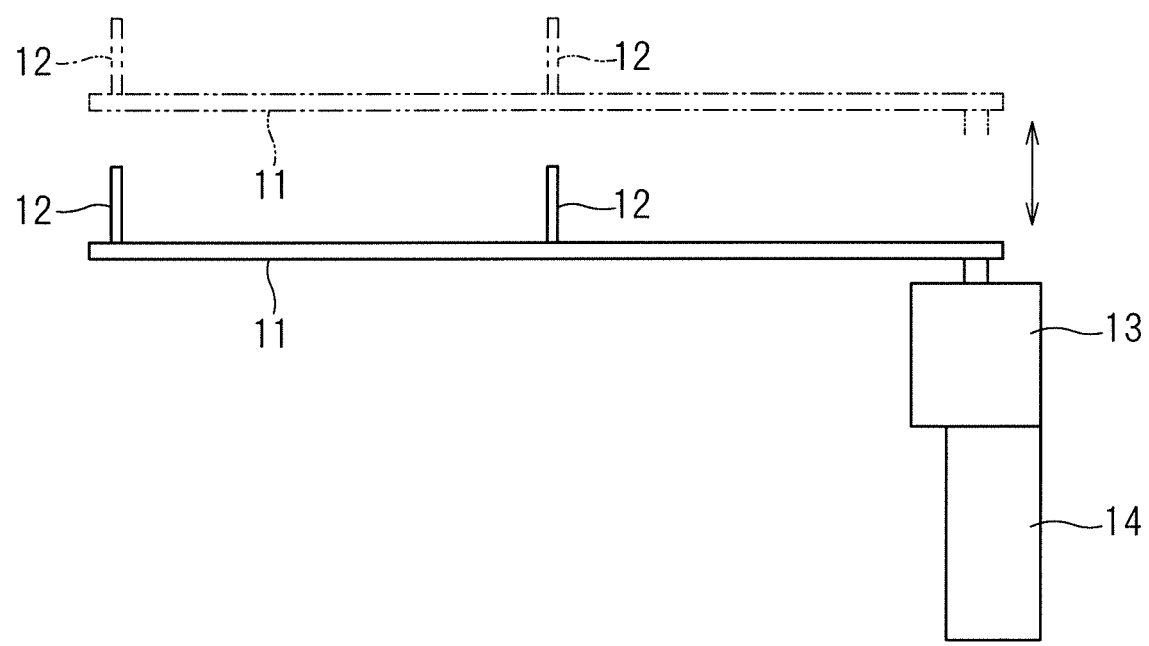
FIG. 6 is a side view of the transfer mechanism.

FIG. 5 is a plan view of the transfer mechanism 10. FIG. 6 is a side view of the transfer mechanism 10. The transfer mechanism 10 includes the two transfer arms 11. The transfer arms 11 are of an arcuate configuration extending substantially along the annular recessed portion 62. Each of the transfer arms 11 includes the two lift pins 12 mounted upright thereon. The transfer arms 11 and the lift pins 12 are made of quartz. The transfer arms 11 are pivotable by a horizontal movement mechanism 13. The horizontal movement mechanism 13 moves the pair of transfer arms 11 horizontally between a transfer operation position (a position indicated by solid lines in FIG. 5) in which the semiconductor wafer W is transferred to and from the holder 7 and a retracted position (a position indicated by dash-double-dot lines in FIG. 5) in which the transfer arms 11 do not overlap the semiconductor wafer W held by the holder 7 as seen in plan view. The horizontal movement mechanism 13 may be of the type which causes individual motors to pivot the transfer arms 11 respectively or of the type which uses the linkage mechanism to cause a single motor to pivot the pair of transfer arms 11 in cooperative relation.

The pair of transfer arms 11 are moved upwardly and downwardly together with the horizontal movement mechanism 13 by an elevating mechanism 14. As the elevating mechanism 14 moves up the pair of transfer arms 11 in their transfer operation position, the four lift pins 12 in total pass through the respective four through holes 79 (with reference to FIGS. 2 and 3) bored in the susceptor 74, so that the upper ends of the lift pins 12 protrude from the upper surface of the susceptor 74. On the other hand, as the elevating mechanism 14 moves down the pair of transfer arms 11 in their transfer operation position to take the lift pins 12 out of the respective through holes 79 and the horizontal movement mechanism 13 moves the pair of transfer arms 11 so as to open the transfer arms 11, the transfer arms 11 move to their retracted position. The retracted position of the pair of transfer arms 11 is immediately over the base ring 71 of the holder 7. The retracted position of the transfer arms 11 is inside the recessed portion 62 because the base ring 71 is placed on the bottom surface of the recessed portion 62. An exhaust mechanism not shown is also provided near the location where the drivers (the horizontal movement mechanism 13 and the elevating mechanism 14) of the transfer mechanism 10 are provided, and is configured to exhaust an atmosphere around the drivers of the transfer mechanism 10 to the outside of the chamber 6.

Referring again to FIG. 1, an oxygen analyzer 99 is provided in the chamber 6. The oxygen analyzer 99 measures the concentration of oxygen in the atmosphere within the chamber 6.

The flash heating part 5 provided over the chamber 6 includes an enclosure 51, a light source provided inside the enclosure 51 and including the multiple (in the present preferred embodiment, 30) xenon flash lamps FL, and a reflector 52 provided inside the enclosure 51 so as to cover the light source from above. The flash heating part 5 further includes a lamp light radiation window 53 mounted to the bottom of the enclosure 51. The lamp light radiation window 53 forming the floor of the flash heating part 5 is a plate-like quartz window made of quartz. The flash heating part 5 is provided over the chamber 6, whereby the lamp light radiation window 53 is opposed to the upper chamber window 63. The flash lamps FL direct a flash of light from over the chamber 6 through the lamp light radiation window 53 and the upper chamber window 63 toward the heat treatment space 65.

The flash lamps FL, each of which is a rod-shaped lamp having an elongated cylindrical shape, are arranged in a plane so that the longitudinal directions of the respective flash lamps FL are in parallel with each other along a main surface of the semiconductor wafer W held by the holder 7 (that is, in the horizontal direction). Thus, a plane defined by the arrangement of the flash lamps FL is also a horizontal plane. A region in which the flash lamps FL are arranged has a size, as seen in plan view, greater than that of the semiconductor wafer W.

Each of the xenon flash lamps FL includes a cylindrical glass tube (discharge tube) containing xenon gas sealed therein and having positive and negative electrodes provided on opposite ends thereof and connected to a capacitor, and a trigger electrode attached to the outer peripheral surface of the glass tube. Because the xenon gas is electrically insulative, no current flows in the glass tube in a normal state even if electrical charge is stored in the capacitor. However, if a high voltage is applied to the trigger electrode to produce an electrical breakdown, electricity stored in the capacitor flows momentarily in the glass tube, and xenon atoms or molecules are excited at this time to cause light emission. This xenon flash lamp FL has the property of being capable of emitting extremely intense light as compared with a light source that stays lit continuously such as a halogen lamp HL because the electrostatic energy previously stored in the capacitor is converted into an ultrashort light pulse ranging from 0.1 to 100 milliseconds. Thus, the flash lamps FL are pulsed light emitting lamps which emit light instantaneously for an extremely short time period of less than one second. The light emission time of the flash lamps FL is adjustable by the coil constant of a lamp light source which supplies power to the flash lamps FL.

The reflector 52 is provided over the plurality of flash lamps FL so as to cover all of the flash lamps FL. A fundamental function of the reflector 52 is to reflect the flash of light emitted from the plurality of flash lamps FL toward the heat treatment space 65. The reflector 52 is a plate made of an aluminum alloy. A surface of the reflector 52 (a surface which faces the flash lamps FL) is roughened by abrasive blasting.

The halogen heating part 4 provided under the chamber 6 includes an enclosure 41 incorporating the multiple (in the present preferred embodiment, 40) halogen lamps HL. The halogen heating part 4 directs light from under the chamber 6 through the lower chamber window 64 toward the heat treatment space 65 to heat the semiconductor wafer W by means of the halogen lamps HL.

Figure 7:
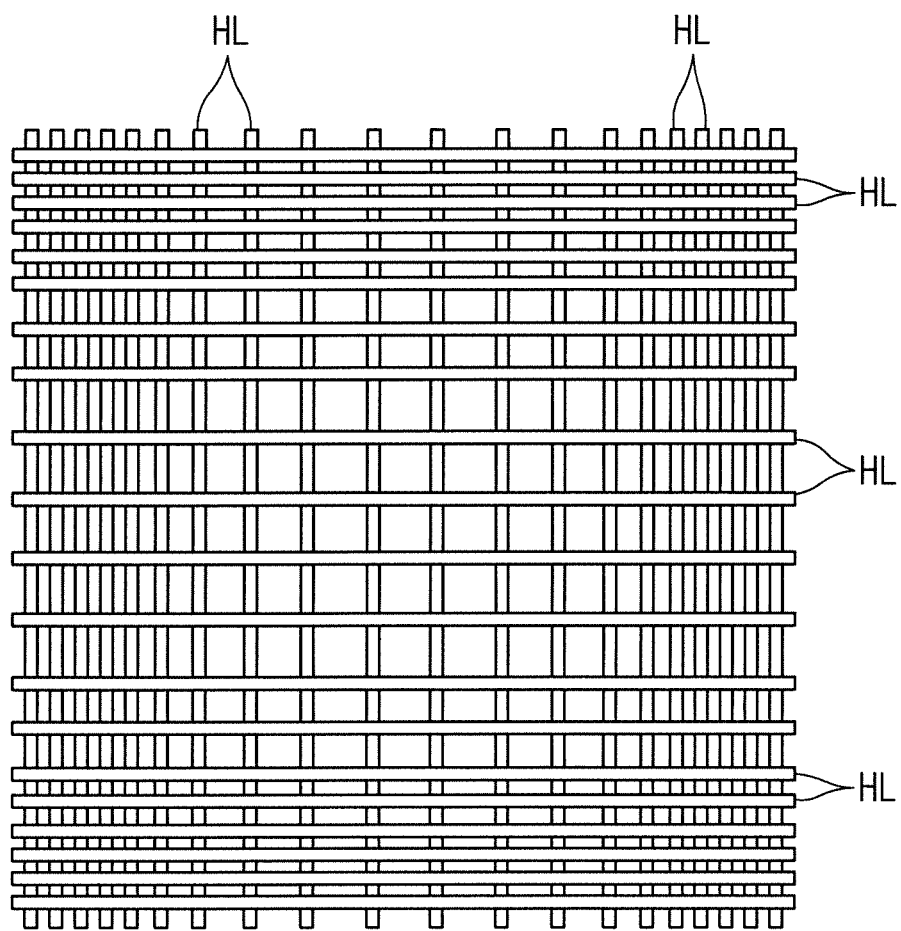
FIG. 7 is a plan view showing an arrangement of a plurality of halogen lamps.

FIG. 7 is a plan view showing an arrangement of the multiple halogen lamps HL. The 40 halogen lamps HL are arranged in two tiers, i.e. upper and lower tiers. 20 halogen lamps HL are arranged in the upper tier closer to the holder 7, and 20 halogen lamps HL are arranged in the lower tier farther from the holder 7 than the upper tier. Each of the halogen lamps HL is a rod-shaped lamp having an elongated cylindrical shape. The 20 halogen lamps HL in each of the upper and lower tiers are arranged so that the longitudinal directions thereof are in parallel with each other along a main surface of the semiconductor wafer W held by the holder 7 (that is, in the horizontal direction). Thus, a plane defined by the arrangement of the halogen lamps HL in each of the upper and lower tiers is also a horizontal plane.

As shown in FIG. 7, the halogen lamps HL in each of the upper and lower tiers are disposed at a higher density in a region opposed to a peripheral portion of the semiconductor wafer W held by the holder 7 than in a region opposed to a central portion thereof. In other words, the halogen lamps HL in each of the upper and lower tiers are arranged at shorter intervals in the peripheral portion of the lamp arrangement than in the central portion thereof. This allows a greater amount of light to impinge upon the peripheral portion of the semiconductor wafer W where a temperature decrease is prone to occur when the semiconductor wafer W is heated by the irradiation thereof with light from the halogen heating part 4.

The group of halogen lamps HL in the upper tier and the group of halogen lamps HL in the lower tier are arranged to intersect each other in a lattice pattern. In other words, the 40 halogen lamps HL in total are disposed so that the longitudinal direction of the 20 halogen lamps HL arranged in the upper tier and the longitudinal direction of the 20 halogen lamps HL arranged in the lower tier are orthogonal to each other.

Each of the halogen lamps HL is a filament-type light source which passes current through a filament disposed in a glass tube to make the filament incandescent, thereby emitting light. A gas prepared by introducing a halogen element (iodine, bromine and the like) in trace amounts into an inert gas such as nitrogen, argon and the like is sealed in the glass tube. The introduction of the halogen element allows the temperature of the filament to be set at a high temperature while suppressing a break in the filament. Thus, the halogen lamps HL have the properties of having a longer life than typical incandescent lamps and being capable of continuously emitting intense light. Thus, the halogen lamps HL are continuous lighting lamps that emit light continuously for at least not less than one second. In addition, the halogen lamps HL, which are rod-shaped lamps, have a long life. The arrangement of the halogen lamps HL in a horizontal direction provides good efficiency of radiation toward the semiconductor wafer W provided over the halogen lamps HL.

A reflector 43 is provided also inside the enclosure 41 of the halogen heating part 4 under the halogen lamps HL arranged in two tiers (FIG. 1). The reflector 43 reflects the light emitted from the halogen lamps HL toward the heat treatment space 65.

The controller 3 controls the aforementioned various operating mechanisms provided in the heat treatment apparatus 1. The controller 3 is similar in hardware configuration to a typical computer. Specifically, the controller 3 includes a CPU that is a circuit for performing various computation processes, a ROM or read-only memory for storing a basic program therein, a RAM or readable/writable memory for storing various pieces of information therein, and a magnetic disk for storing control software, data and the like therein. The CPU in the controller 3 executes a predetermined treatment program, whereby the processes in the heat treatment apparatus 1 proceed.

The heat treatment apparatus 1 further includes, in addition to the aforementioned components, various cooling structures to prevent an excessive temperature rise in the halogen heating part 4, the flash heating part 5, and the chamber 6 because of the heat energy generated from the halogen lamps HL and the flash lamps FL during the heat treatment of a semiconductor wafer W. As an example, a water cooling tube (not shown) is provided in the walls of the chamber 6. Also, the halogen heating part 4 and the flash heating part 5 have an air cooling structure for forming a gas flow therein to exhaust heat. Air is supplied to a gap between the upper chamber window 63 and the lamp light radiation window 53 to cool down the flash heating part 5 and the upper chamber window 63.

Figure 8:
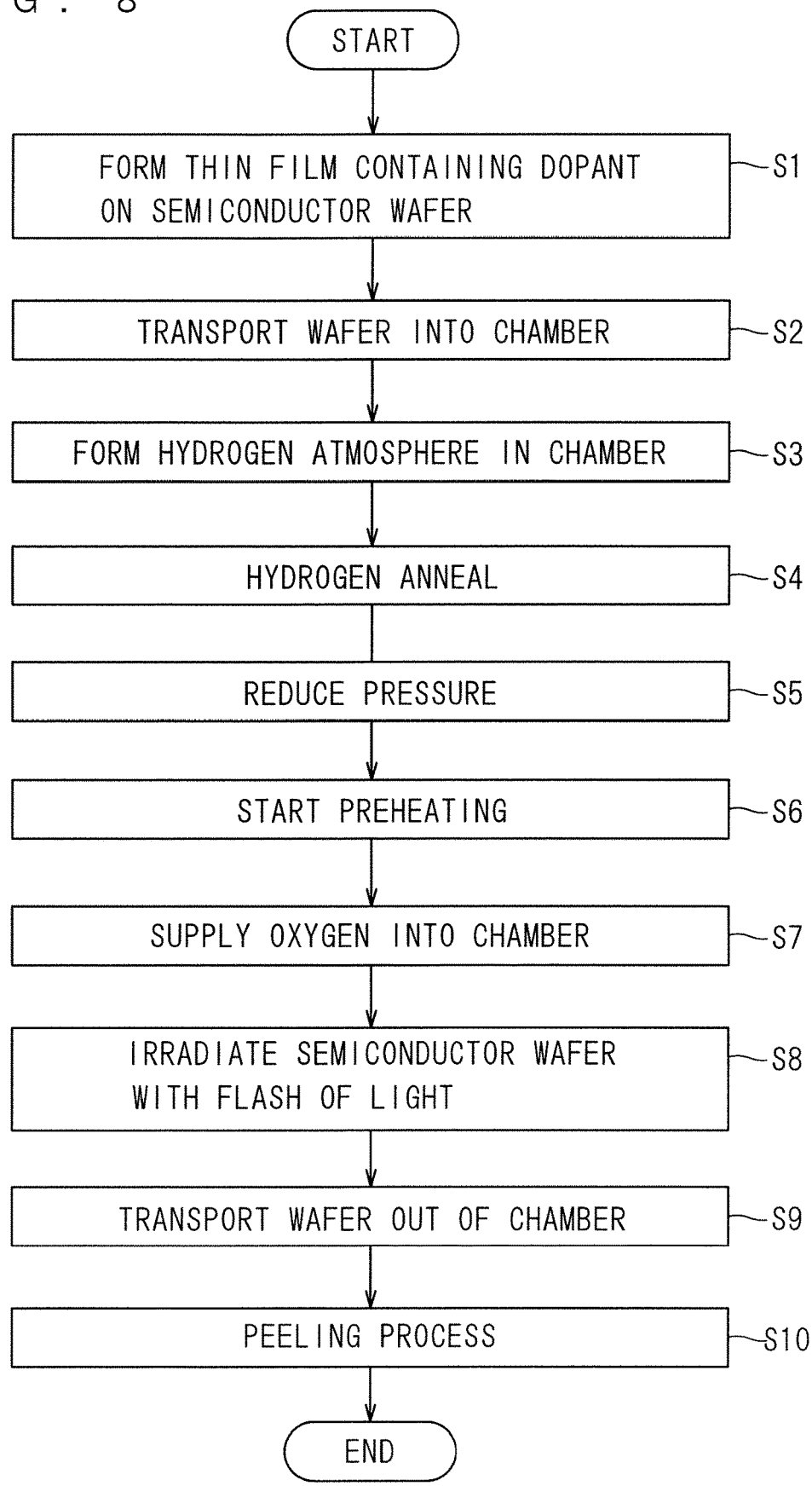
FIG. 8 is a flow diagram showing a procedure for a heat treatment method according to the present invention.

Next, a heat treatment method according to the present invention will be described. FIG. 8 is a flow diagram showing a procedure for the heat treatment method according to the present invention. A semiconductor wafer to be treated in the present preferred embodiment is a silicon (Si) semiconductor wafer W. First, a thin film containing a dopant is formed on the surface of the silicon semiconductor wafer W (Step S1). The film formation process in Step S1 is executed by a film formation apparatus different from the heat treatment apparatus 1 described above. Specifically, an application liquid containing the dopant is dropped on the semiconductor wafer W rotated by a spin coater to thinly spread the application liquid on the front surface of the semiconductor wafer W by a centrifugal force. Applied to the application liquid is an organic solvent containing carbon such as propylene glycol methyl ether acetate (PG-MEA), for example. Subsequently, the applied film formed on the front surface of the semiconductor wafer W is dried to form the thin film containing the dopant and carbon. Prior to the film formation process in Step S1, a cleaning process using hydrofluoric acid and the like may be performed on the front surface of the semiconductor wafer W.

FIG. 9 is a drawing schematically showing a sectional structure of the semiconductor wafer W on which the thin film containing the dopant is formed. A natural oxide film 101 of silicon dioxide ($SiO_2$) is formed on the front surface of the silicon semiconductor wafer W. The natural oxide film 101 is not formed on purpose, but starts to grow again immediately after a removal process, even when the cleaning process is performed on the front surface of the semiconductor wafer W using hydrofluoric acid or the like, and is inevitably formed. Accordingly, a thin film 102 containing the dopant is formed on the natural oxide film 101 by necessity. That is to say, the natural oxide film 101 is sandwiched between the thin film 102 containing the dopant and the front surface of the semiconductor wafer W. A film thickness of the natural oxide film 101 is approximately 1 nm, for example, and a film thickness of the formed thin film 102 is approximately 10 nm, for example.

Next, the semiconductor wafer W on which the thin film 102 containing the dopant and carbon is formed is transported into the chamber 6 of the heat treatment apparatus 1 (Step S2). Specifically, the gate valve 185 is opened to open the transport opening 66. A transport robot outside the heat treatment apparatus 1 transports the semiconductor wafer W through the transport opening 66 into the heat treatment space 65 of the chamber 6. At this time, nitrogen gas may be supplied into the chamber 6 from the gas supply part 90 and caused to flow outwardly through the transport opening 66, thereby minimizing an outside atmosphere carried into the heat treatment space 65 as the semiconductor wafer W is transported into the heat treatment space 65.

The semiconductor wafer W transported into the heat treatment space 65 by the transport robot is moved forward to a position lying immediately over the holder 7 and is stopped thereat. Then, the pair of transfer arms 11 of the transfer mechanism 10 is moved horizontally from the retracted position to the transfer operation position and is then moved upwardly, whereby the lift pins 12 pass through the through holes 79 and protrude from the upper surface of the holding plate 75 of the susceptor 74 to receive the semiconductor wafer W. At this time, the lift pins 12 move upwardly to above the upper ends of the substrate support pins 77.

After the semiconductor wafer W is placed on the lift pins 12, the transport robot moves out of the heat treatment space 65, and the gate valve 185 closes the transport opening 66. Then, the pair of transfer arms 11 moves downwardly to transfer the semiconductor wafer W from the transfer mechanism 10 to the susceptor 74 of the holder 7, so that the semiconductor wafer W is held in a horizontal attitude from below. The semiconductor wafer W is supported by the substrate support pins 77 provided upright on the holding plate 75, and is held by the susceptor 74. The semiconductor wafer W is held by the holder 7 in such an attitude that the front surface thereof where the thin film 102 containing the dopant is formed is the upper surface. A predetermined distance is defined between a back surface (a main surface opposite from the front surface) of the semiconductor wafer W supported by the substrate support pins 77 and the holding surface 75a of the holding plate 75. The pair of transfer arms 11 moved downwardly below the susceptor 74 is moved back to the retracted position, i.e. to the inside of the recessed portion 62, by the horizontal movement mechanism 13.

After the gate valve 185 closes the transport opening 66 so that the heat treatment space 65 becomes an enclosed space, an atmosphere containing hydrogen is formed within the chamber 6 (Step S3). Specifically, the valve 92 is opened, and hydrogen gas is supplied from the gas supply opening 81 into the heat treatment space 65. At this time, nitrogen gas is also supplied at the same time, and a gas mixture of hydrogen gas and nitrogen gas is supplied as the treatment gas from the gas supply part 90. Also, the valve 89 is opened, and the gas within the chamber 6 is exhausted through the gas exhaust opening 86. This causes the treatment gas supplied from an upper portion of the heat treatment space 65 in the chamber 6 to flow downwardly and then to be exhausted from a lower portion of the heat treatment space 65. Thus, the atmosphere within the chamber 6 is replaced with an atmosphere containing hydrogen. A concentration of hydrogen in the atmosphere containing hydrogen formed within the chamber 6 is approximately 4 vol %, for example. The gas within the chamber 6 is exhausted also through the transport opening 66 by opening the valve 192. Further, the exhaust mechanism not shown exhausts an atmosphere near the drivers of the transfer mechanism 10.

After the atmosphere containing hydrogen is formed within the chamber 6, a hydrogen anneal of the semiconductor wafer W is executed by the halogen lamps HL in the halogen heating part 4 (Step S4). FIG. 10 is a view showing a change in a temperature of the front surface of the semiconductor wafer W. After the atmosphere containing hydrogen is formed within the chamber 6, at time t1, the 40 halogen lamps HL in the halogen heating part 4 turn on simultaneously to start the heating of the semiconductor wafer W. Halogen light emitted from the halogen lamps HL is transmitted through the lower chamber window 64 and the susceptor 74 both made of quartz, and impinges from the back surface of the semiconductor wafer W. By receiving light irradiation from the halogen lamps HL, the semiconductor wafer W is heated, so that the temperature of the semiconductor wafer W increases. It should be noted that the transfer arms 11 of the transfer mechanism 10, which are retracted to the inside of the recessed portion 62, do not become an obstacle to the heating using the halogen lamps HL.

The temperature of the semiconductor wafer W is measured with the radiation thermometer 20 when the halogen lamps HL perform the heating treatment. Specifically, the radiation thermometer 20 receives infrared radiation emitted from the lower surface of the semiconductor wafer W held by the susceptor 74 through the opening 78 and passing through the transparent window 21 to measure the temperature of the semiconductor wafer W which is on the increase. The measured temperature of the semiconductor wafer W is transmitted to the controller 3. The controller 3 controls the output from the halogen lamps HL while monitoring whether the temperature of the semiconductor wafer W which is on the increase by the irradiation with light from the halogen lamps HL reaches a predetermined anneal temperature T1 or not. In other words, the controller 3 effects feedback control of the output from the halogen lamps HL so that the temperature of the semiconductor wafer W is equal to the anneal temperature T1, based on the value measured with the radiation thermometer 20. The anneal temperature T1 in the hydrogen anneal is equal to or larger than 300° C. and equal to or smaller than 600° C., and is preferably equal to or larger than 400° C. and equal to or smaller than 500° C.

After the temperature of the semiconductor wafer W reaches the anneal temperature T1 at time t2, the controller 3 maintains the temperature of the semiconductor wafer W at the anneal temperature T1 for a preset time of hydrogen anneal. Specifically, at the time t2 when the temperature of the semiconductor wafer W measured with the radiation thermometer 20 reaches the anneal temperature T1, the controller 3 adjusts the output from the halogen lamps HL to maintain the temperature of the semiconductor wafer W at approximately the anneal temperature T1 until time t3. The time of hydrogen anneal from time t2 to time t3 is equal to or larger than one second and equal to or smaller than one hour, and is preferably equal to or larger than one minute and equal to or smaller than thirty minutes.

In the heating using the halogen lamps HL, the temperature of the entire semiconductor wafer W is uniformly increased to the anneal temperature T1. In the stage of heating using the halogen lamps HL, the semiconductor wafer W shows a tendency to be lower in temperature in the peripheral portion thereof where heat dissipation is liable to occur than in the central portion thereof. However, the halogen lamps HL in the halogen heating part 4 are disposed at a higher density in the region opposed to the peripheral portion of the semiconductor wafer W than in the region opposed to the central portion thereof. This causes a greater amount of light to impinge upon the peripheral portion of the semiconductor wafer W where heat dissipation is liable to occur, thereby providing a uniform in-plane temperature distribution of the semiconductor wafer W.

The semiconductor wafer W having, on the surface thereof, the thin film 102 containing the dopant with the natural oxide film 101 therebetween is heated to the anneal temperature T1 in a hydrogen atmosphere, thus a diffusion speed of the dopant atoms in the silicon dioxide increases. As a result, the dopant atoms contained in the thin film 102 are considered to be diffused in the natural oxide film 101 and accumulate in an interface between the front surface of the semiconductor wafer W and the natural oxide film 101 at high concentration.

When the anneal temperature T1 is equal to or smaller than 600° C., there is no possibility that the dopant atoms contained in the thin film 102 are diffused in the front surface of the semiconductor wafer W beyond the natural oxide film 101. When the anneal temperature T1 is equal to or larger than 300° C., the dopant atoms can be diffused in the natural oxide film 101. For the reason described above, the anneal temperature T1 in the hydrogen anneal is limited to be equal to or larger than 300° C. and equal to or smaller than 600° C.

A pressure reduction in the chamber 6 is performed at time t3 after an elapse of a predetermined time of hydrogen anneal (Step S5). Specifically, in a state where the valve 91 and the valve 92 are closed and the gas supply into the chamber 6 is stopped, the valve 89 is opened and the hydrogen atmosphere within the chamber 6 is exhausted, whereby the pressure within the chamber 6 is reduced to a pressure lower than atmospheric pressure.

Next, preheating (or assist-heating) of the semiconductor wafer W is started at time t4 (Step S6). When the process shifts to the preheating process, the controller 3 makes the output of the halogen lamps HL larger than that in the hydrogen anneal process, and increases an intensity of halogen light emitted to the back surface of the semiconductor wafer W. Thus, the temperature of the semiconductor wafer W further increases from the anneal temperature T1.

After the preheating of the semiconductor wafer W is started, the valve 91 is opened and oxygen gas is supplied from the gas supply opening 81 into the chamber 6 (Step S7). Accordingly, the hydrogen atmosphere in the heat treatment space 65 within the chamber 6 is replaced with the oxygen atmosphere. The pressure reduction in the chamber 6 filled with the hydrogen atmosphere is performed once and hydrogen is exhausted, and subsequently, oxygen gas is supplied into the chamber 6 to form the oxygen atmosphere, thus the atmosphere can be replaced smoothly and rapidly. A concentration of oxygen within the chamber 6 can be appropriately set, and may be set to 100%, for example. The concentration of oxygen within the chamber 6 is measured with the oxygen analyzer 99.

Also in the preheating process, in the manner similar to the hydrogen anneal process, the controller 3 effects feedback control of the output from the halogen lamps HL so that the temperature of the semiconductor wafer W is equal to the preheating temperature T2, based on the value measured with the radiation thermometer 20. The preheating temperature T2 is equal to or larger than 600° C. and equal to or smaller than 1100° C., that is higher than the anneal temperature T1 in the hydrogen anneal. After the temperature of the semiconductor wafer W reaches the preheating temperature T2, the controller 3 adjusts the output of the halogen lamps HL and tentatively maintains the temperature of the semiconductor wafer W at the preheating temperature T2.

At a time t5 when a predetermined time period has elapsed since the temperature of the semiconductor wafer W reaches the preheating temperature T2, the flash lamps FL in the flash heating part 5 irradiate the front surface of the semiconductor wafer W held by the susceptor 74 with a flash of light (Step S8). At this time, part of the flash of light emitted from the flash lamps FL travels directly toward the interior of the chamber 6. The remainder of the flash of light is reflected once from the reflector 52, and then travels toward the interior of the chamber 6. The irradiation of the semiconductor wafer W with such a flash of light achieves the flash heating of the semiconductor wafer W.

The flash heating, which is achieved by the emission of a flash of light from the flash lamps FL, is capable of increasing the temperature of the front surface of the semiconductor wafer W in a short time. Specifically, the flash of light emitted from the flash lamps FL is an intense flash of light emitted for an extremely short period of time ranging from about 0.1 to about 100 milliseconds as a result of the conversion of the electrostatic energy previously stored in the capacitor into such an ultrashort light pulse. The temperature of the front surface of the semiconductor wafer W including the thin film 102 and the natural oxide film 101 is increased momentarily to a peak temperature T3 by the flash irradiation from the flash lamps FL, and thereafter decreases rapidly. The peak temperature T3 is higher than the preheating temperature T2 and smaller than a melting point of the silicon semiconductor wafer W.

The time period for the flash irradiation in the flash heating is an extremely short time period of 100 milliseconds or less. Thus, the time period during which the temperature of the front surface of the semiconductor wafer W is the peak temperature T3 is smaller than one second. That is to say, the flash heating is a millisecond anneal of heating the front surface of the semiconductor wafer W to the peak temperature T3 for less than one second.

When the semiconductor wafer W is preheated to the preheating temperature T2 and subsequently the flash irradiation is performed in the oxygen atmosphere, the dopant atoms accumulating in the interface between the front surface of the semiconductor wafer W and the natural oxide film 101 are diffused into the surface of the semiconductor wafer W and the diffused dopant atoms are activated. As a result, a diffusion layer of dopant is formed on the front surface of the semiconductor wafer W.

At the same time, when the semiconductor wafer W on which the thin film 102 containing the dopant and carbon is formed is preheated to the preheating temperature T2 and subsequently the flash heating is performed thereon in the oxygen atmosphere, binding of carbon in the thin film 102 and oxygen in the atmosphere is promoted, and carbon in the thin film 102 is exhausted from the thin film 102 as carbon dioxide ($CO_2$). As a result, the hardening of the thin film 102 due to the heat treatment can be prevented.

In this manner, in the present preferred embodiment, the introduction and activation of the dopant and the binding of carbon in the thin film 102 and oxygen are performed at the same time by the flash irradiation in the oxygen atmosphere.

Accordingly, the diffusion layer of dopant is formed on the front surface of the semiconductor wafer W and the hardening of the thin film 102 can be prevented.

After the completion of the flash heating treatment, the halogen lamps HL also turn off, thus the temperature of the semiconductor wafer W decreases rapidly. The pressure reduction in the chamber 6 is performed again to exhaust the oxygen atmosphere, and the atmosphere within the chamber 6 is replaced with a nitrogen atmosphere. The radiation thermometer 20 measures the temperature of the semiconductor wafer W which is on the decrease. The result of measurement is transmitted to the controller 3. The controller 3 monitors whether the temperature of the semiconductor wafer W is decreased to a predetermined temperature or not, based on the result of measurement with the radiation thermometer 20. After the temperature of the semiconductor wafer W is decreased to the predetermined temperature or below, the pair of transfer arms 11 of the transfer mechanism 10 is moved horizontally again from the retracted position to the transfer operation position and is then moved upwardly, so that the lift pins 12 protrude from the upper surface of the susceptor 74 to receive the heat-treated semiconductor wafer W from the susceptor 74. Subsequently, the transport opening 66 which has been closed is opened by the gate valve 185, and the transport robot outside the heat treatment apparatus 1 transports the semiconductor wafer W placed on the lift pins 12 to the outside. Thus, the heat treatment apparatus 1 completes the heating treatment of the semiconductor wafer W (Step S9).

A peeling process of peeling the thin film 102 which is unnecessary is performed on the semiconductor wafer W transported from the chamber 6 in the heat treatment apparatus 1 (Step S10). Various dry methods or wet methods can be adopted as the peeling process. Carbon in the thin film 102 is bound to oxygen in the atmosphere to prevent the hardening of the thin film 102, thus the thin film 102 can be easily peeled.

In the present preferred embodiment, the semiconductor wafer W on which the thin film 102 containing the dopant and carbon is formed is heated in the oxygen atmosphere, thus the activation of dopant and the binding of carbon in the thin film 102 and oxygen in the atmosphere are promoted, and carbon is exhausted from the thin film 102 to prevent the hardening of the thin film 102. As a result, the thin film 102 containing carbon can be easily peeled from the semiconductor wafer W.

The anneal process is performed on the semiconductor wafer W in the hydrogen atmosphere before the heat treatment in the oxygen atmosphere. Accordingly, it is possible to accumulate the dopant in the interface between the front surface of the semiconductor wafer W and the natural oxide film 101 at high concentration before the flash heating, and the dopant can be easily introduced into the front surface of the semiconductor wafer W at the time of flash heating.

While the preferred embodiments according to the present invention have been described hereinabove, various modifications of the present invention are possible in addition to those described above without departing from the scope and spirit of the present invention. For example, oxygen gas is supplied from the gas supply part 90 into the chamber 6 to form an oxidizing atmosphere in the aforementioned preferred embodiment, however, ozone ($O_3$) or nitrogen oxide ($NO_x$) may be supplied from the gas supply part 90 to form the oxidizing atmosphere instead. The nitride oxide includes nitric oxide (NO), nitrous oxide ($N_2O$), and nitrogen dioxide ($NO_2$). In other words, it is only necessary that an oxidizing gas containing one type of gas selected from a group composed of oxide, ozone, and nitrogen oxide is supplied into the chamber 6 to form an oxidizing atmosphere. Alternatively, oxygen radicals and water vapor, for example, may be supplied into the chamber 6 to form the oxidizing atmosphere. When the semiconductor wafer W on which the thin film 102 containing the dopant and carbon is formed is heated in the aforementioned oxidizing atmosphere, the oxidization of carbon in the thin film 102 is promoted and carbon is exhausted from the thin film 102, thus the thin film 102 can be easily peeled from the semiconductor wafer W.

The flash lamps FL may irradiate the semiconductor wafer W on which the thin film 102 is formed with a flash of light including ultraviolet light. The flash of light including the ultraviolet light is a flash of light including a peak of wavelength of 400 nm or less in a spectral distribution. The semiconductor wafer W on which the thin film 102 is formed is irradiated with the flash of light including the ultraviolet light in the oxidizing atmosphere, thus the oxidization of carbon is promoted and an ashing process can be performed on the thin film 102 by a chemical reaction of ultraviolet light. Accordingly, the thin film 102 containing carbon can be peeled from the semiconductor wafer W more easily.

An appropriate oxidizing gas is selected and a condition of the heat treatment in the oxidizing atmosphere is optimized, thus the entire thin film 102 containing carbon can be resolved by the heat treatment. According to such a configuration, the peeling process in Step S10 can be omitted to reduce the number of manufacturing processes.

In the aforementioned preferred embodiment, the anneal process is performed on the semiconductor wafer W in the hydrogen atmosphere before the preheating and the flash heating, however, the anneal process may be performed on the semiconductor wafer W in the nitrogen atmosphere instead. However, the diffusion speed of the dopant atoms in the silicon dioxide increases in the hydrogen atmosphere, thus the dopant atoms can be diffused in the natural oxide film 101 more rapidly.

Although the 30 flash lamps FL are provided in the flash heating part 5 according to the aforementioned preferred embodiment, the present invention is not limited to this. Any number of flash lamps FL may be provided. The flash lamps FL are not limited to the xenon flash lamps, but may be krypton flash lamps. Also, the number of halogen lamps HL provided in the halogen heating part 4 is not limited to 40. Any number of halogen lamps HL may be provided.

In the aforementioned preferred embodiments, the filament-type halogen lamps HL are used as continuous lighting lamps that emit light continuously for not less than one second to perform the hydrogen anneal and the preheating on the semiconductor wafer W. The present invention, however, is not limited to this. In place of the halogen lamps HL, discharge type arc lamps (e.g., xenon arc lamps) may be used as continuous lighting lamps to perform the hydrogen anneal and the preheating.

While the invention has been shown and described in detail, the foregoing description is in all aspects illustrative and not restrictive. It is therefore understood that numerous modifications and variations can be devised without departing from the scope of the invention.

What is claimed is:

1. A heat treatment method of heating a substrate by irradiating said substrate with light, comprising steps of:
   (a) storing a substrate on which a thin film containing a dopant and carbon is formed in a chamber;
   (b) supplying an oxidizing gas into the chamber to form an oxidizing atmosphere; and
   (c) irradiating the substrate with light to heat the substrate, the step of (c) including steps of:

(c-1) irradiating the substrate with light from continuous lighting lamps; and (c-2) irradiating the substrate with a flash of light from flash lamps after the step of (c-1), wherein a supply of the oxidizing gas into the chamber is started halfway through the step of (c-1).

2. The heat treatment method according to claim 1, wherein the step of (c) further includes a step of:

(c-3) irradiating the substrate with light from the continuous lighting lamps before the step of (c-1) to maintain a temperature of the substrate lower than a temperature of the substrate in the step of (c-1), wherein the step of (c-3) is performed by forming a hydrogen atmosphere or a nitrogen atmosphere in the chamber.

3. The heat treatment method according to claim 1, wherein

In the step of (c-2), the substrate is irradiated with a flash of light including ultraviolet light.

4. The heat treatment method according to claim 1, wherein the oxidizing gas contains one type of gas selected from a group composed of oxide, ozone, and nitrogen oxide.

* * * * *